United States Patent [19]

Go

[11] Patent Number: 4,764,846
[45] Date of Patent: Aug. 16, 1988

[54] HIGH DENSITY ELECTRONIC PACKAGE COMPRISING STACKED SUB-MODULES

[75] Inventor: Tiong C. Go, El Toro, Calif.

[73] Assignee: Irvine Sensors Corporation, Costa Mesa, Calif.

[21] Appl. No.: 562

[22] Filed: Jan. 5, 1987

[51] Int. Cl.[4] .............................................. H05K 7/00
[52] U.S. Cl. .................................... 361/388; 29/830; 361/386
[58] Field of Search ................................ 29/830, 840; 361/386–389, 392–394, 396, 414

[56] References Cited

U.S. PATENT DOCUMENTS

| | | | |
|---|---|---|---|
| 2,803,788 | 8/1957 | Sanders, Jr. | 361/393 |
| 3,147,402 | 9/1964 | Hochstetler | 361/388 |
| 3,227,926 | 1/1966 | Parstorfer et al. | 361/396 |
| 3,268,772 | 8/1966 | Kamei et al. | 361/388 |
| 3,403,300 | 9/1968 | Horowitz et al. | 361/393 |
| 3,898,535 | 8/1975 | Ebbert | 361/388 |

FOREIGN PATENT DOCUMENTS

| | | | |
|---|---|---|---|
| 2122032 | 4/1984 | United Kingdom | 361/394 |
| 2145571 | 3/1985 | United Kingdom | 361/414 |

OTHER PUBLICATIONS

Jackson et al., "Heat Transfer Structure for Electronic Subassemblies", IBM Technical Disclosure Bulletin, vol. 13, No. 12, May 1971, pp. 3644–3645.

Primary Examiner—M. H. Paschall
Assistant Examiner—Greg Thompson
Attorney, Agent, or Firm—Thomas J. Plante

[57] ABSTRACT

A high density electronic package is disclosed in which a stack of layer-like sub-modules have their edges secured to a stack-carrying substrate, the latter being in a plane perpendicular to the planes in which the sub-modules extend. Each sub-module has a cavity, inside which one or more IC chips are located. Each cavity-providing sub-module may be formed either by securing a rectangular frame to a chip-carrying substrate, or by etching a cavity in a single piece of material. In the latter case, the chips are mounted on the flat surface of one sub-module, and located inside the cavity of the next sub-module.

18 Claims, 4 Drawing Sheets

HIGH DENSITY ELECTRONIC PACKAGE COMPRISING STACKED SUB-MODULES

BACKGROUND OF THE INVENTION

This invention relates to high-density electronic packages, which are capable of incorporating more electronic capacity in a given space, or reducing the space required for a given amount of electronic capacity. Such packages are particularly useful as computer memories, control logic, arithmetic units, and the like.

The electronic density is obtained by means of a structure in which integrated circuit (IC) chips are stacked to form a three-dimensional structure. The stacked chip structure: (a) has atleast one interconnect plane which is adapted to be electrically connected to external circuitry; and (b) contains within its volume a very extensive electronic system. The term "interconnect plane" (which in related applications is referred to as an "access plane") signifies that electrical leads extend to that planar surface of the stacked chip structure.

A common assumption concerning such stacked IC chips is that the heat generated in the enclosed circuitry cannot be adequately dissipated.

In various prior applications and patents assigned to the assignee of this application, stacks of silicon IC chips have been proposed. One of those applications is U.S. application Ser. No. 856,835, filed Apr. 25, 1986 by the same inventor as the present application. That application discloses a three-dimensional module of stacked layers, or chips, each of which layers carries IC circuits whose leads extend to a common interconnect plane of the module. Electrically conductive bumps deposited on the access plane of the module are aligned with, and bonded to, electrically conductive bumps on a supporting substrate, thereby connecting the circuitry in the stacked layers to external circuitry.

Various limitations and deficiencies in the prior developments have led to the present invention. One such limitation is the fact that IC chips, such as memory devices, which are preferably obtained as standard (off-the-shelf) items from suppliers, must be modified to provide external leads only at one edge, instead of two edges, of each chip.

Perhaps the most critical problems encountered have been due to the electrically conductive properties of the material of the stacked chips, except for such materials as gallium arsenide and sapphire. Because the electrical leads at the interconnect plane must be insulated from the semiconductor material, it has been necessary to apply passivation material on the interconnect plane, and then to form T-shaped electrical connections by applying thin-film metallization to the interconnect plane.

These "T-connects" are fragile and therefore not very reliable. In the case of a silicon stack, the reliability of the "T-connects" depends to a large extent on the quality of the passivation layer. Another problem centers around the epoxy glue between layers, which is troublesome in several ways. Glue thickness variations, for example, can cause problems during certain processing steps, and the glue limits the stack's operating temperature to about 100° C. It also limits the choice of material for the bonding bumps (to avoid degrading the glue and passivation due to high temperature). In addition to the "T-connect" problem and the glue problem, there is also a probem with flip-chip bonding (bump bonding) of the stacked chip module to a substrate.

Flip-chip bonding has been less reliable as a method for making electrical interconnections than other methods, such as TAB bonding and wire bonding. In particular, it is not very practical in a mass production environment.

Another issue addressed by the present invention concerns heat transfer, particularly where the IC chips have high power requirements. Although silicon has reasonable heat-conducting properties, there is still the possibility of overheating problems in silicon stacks. Furthermore, the heat dissipation problem appears almost insurmountable (in stacked chip modules), if non-heat-conducting chips made of poor thermally-conducting material, such as gallium arsenide (GaAs), are used.

Such chips have certain advantages over silicon, including their ability to provide much higher speed electronic signals. However, the use of GaAs devices at higher speeds and temperatures, in the future can be expected to create packaging problems. As operating frequency increases into the gigahertz range, chip temperature increases and electrical/material properties begin to vary significantly. As a result, many other electrical properties are also affected; they include signal progagation delay, signal rise time, and characteristic impedances. Requirements for innovative denser packaging to help alleviate these problems have become critical. It is therefore obvious that special temperature considerations must be given to the packaging of GaAs devices to avoid degradation of their high speed performance.

SUMMARY OF THE INVENTION

The present invention uses a "picture frame" concept to permit the use of standard IC chips in a stacked module. Each chip is located in a "cavity" provided by a supporting substrate, and a surrounding frame which acts as a spacer between two supporting substrates. The spacer may be either a separate member, or an integral part of the supporting substrate.

The material used to form both the chip-supporting substrates, and the chip-surrounding spacer frames, is a dielectric material having good thermal conduction properties, such as beryllium oxide (BeO), for high power devices, or aluminum oxide (A10) for low power devices.

After the "picture frame" layers -(each comprising a substrate, frame, and chip)- have been stacked and secured together, the stacked structure is secured to a module-carrying substrate, which preferably is formed of the same thermally-conductive dielectric material.

If the chip-carrying substrates are fabricated separately from the chip-surrounding spacers, electrical leads formed by metallization processes on the cvity side of the chip-carrying substrates can extend to, and be directly connected to, electrical leads formed on the module-carrying substrate. On the other hand, if the spacer is an integral part of the substrate, electrical leads are formed on the back side, i.e., the side away from the cavity.

Because the IC chips are mounted on substrates, and in cavities, standard IC chips can be used. The necessary chip-connected leads are formed on the substrate. This also permits combining different types of chips. A plurality of separate chips may be included on a single chip-carrying substrate, e.g., high density RAM, processor, and control logic chips. The advantage of using a plurality of chips on a single chip-carrying substrate is the simplification of their interconnecting leads.

An important aspect of the present invention is the heat conductive path, which carries heat directly from each chip to a substrate, and from each chip-carrying substrate to the stack-carrying substrate.

DETAILED DESCRIPTION OF SPECIFIC EMBODIMENTS

Figure 1:
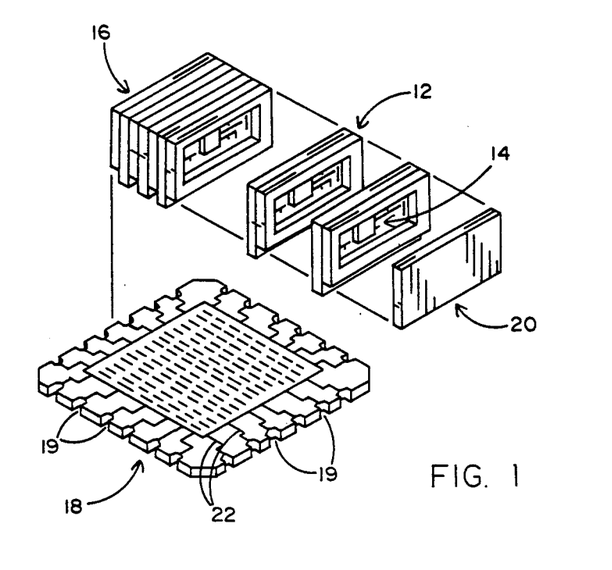
FIG. 1 is an exploded isometric view of the components which constitute the high-density electronic unit of the present invention.

As shown in FIG. 1, the electronic module is formed by first constructing a plurality of individual chip carriers 12, each of which has an IC chip 14 mounted in a cavity in the carrier. Then the chip carriers 12 are secured together in a laminated stack 16; and the stack, as a unit, is secured to a wiring board, or stack-carrying substrate, 18. All of the cavities are enclosed. As shown, a cover 20 is secured at one end of the stack. For some applications, it is necessary that the spaces containing the IC chips 14 be hermetically sealed.

Figure 2:
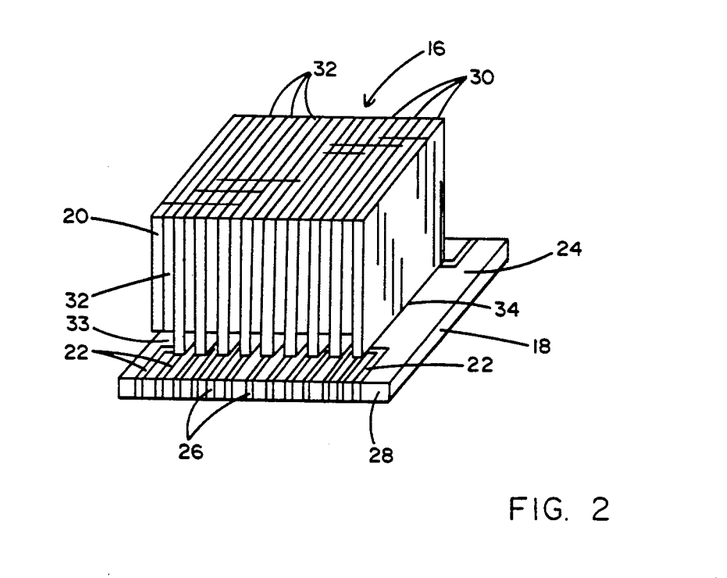
FIG. 2 is an isometric view of the assembled highdensity electronic module.

FIG. 2 shows the assembled unit. The stack-carrying substrate, or wiring board, 18 has a plurality of electrical conductors 22 formed on its stack-engaging surface 24, leading to the edges of the substrate. As shown, the conductors 22 are connected to conductors 26 on the edge 28 of the stack-carrying substrate.

The laminated stack 16 has alternating flat chip-carrying substrates 30 and "picture frame" spacers 32, which surround the spaces, or cavities, in which the IC chips are mounted. The end cap, or cover, 20 covers the end spacer. The stack 16 is supported on, and secured to, the wiring board (stack-carrying substrate) 18 by means of the lower edges 34 of the chip-carrying substrates 30. A suitable method of securing edges 34 to the board 18 is reflow soldering, which provides effective heat-conduction as well as electrical paths.

The stacked chip-carrying substrates 30, the stack-carrying substrates 18, and the frame-shaped spacers 32, should all be formed of material which is both dielectric and an effective thermal conductor. The preferred material is considered to be beryllium oxide (BeO). It is a ceramic material which has good heat conduction properties. As stated above, operating temperatures are often the limiting factor in increasing the density of electronic circuitry. In the present invention, this problem is dealt with both by providing effective heat dissipation, and by utilizing materials which tolerate relatively high temperatures.

In FIG. 1, the outer edges of stack-carrying substrate 18 have notches 19 formed therein at the end of each conductor 22. FIG. 2 shows a different structure, in that each conductor 22 connects to a conductor 26 formed on edge 28 of the stack-carrying substrate. The conductors on the notched substrate of FIG. 1 are adapted to be soldered directly to a PC board by means of solder in the notches. This arrangement conforms to the industry's "surface mount technology" standard. FIG. 2 is adapted to use an alternative connecting technique, in which leads (not shown) can be either clipped on or side brazed to the metallized conductors 22/26.

Figure 3:
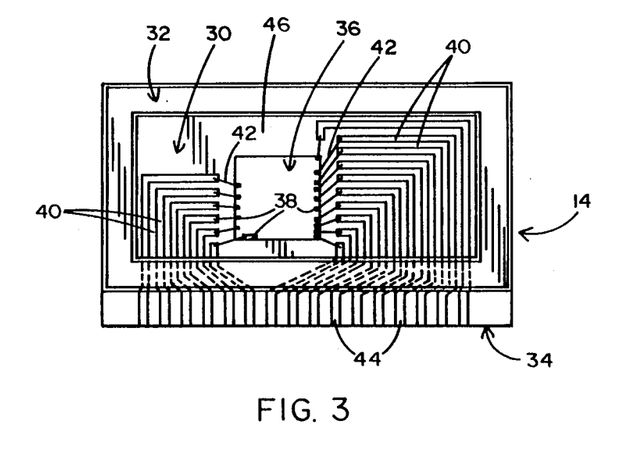
FIGS. 3 and 4 are plan and end views, respectively, of a single layer prior to stacking.
Figure 4:
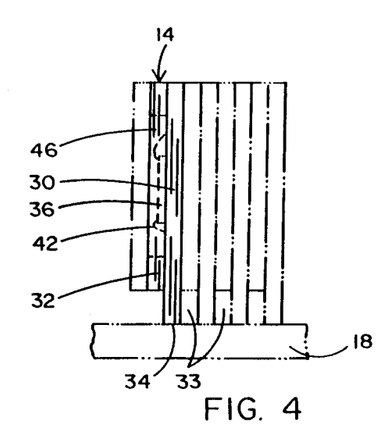
Figure 5:
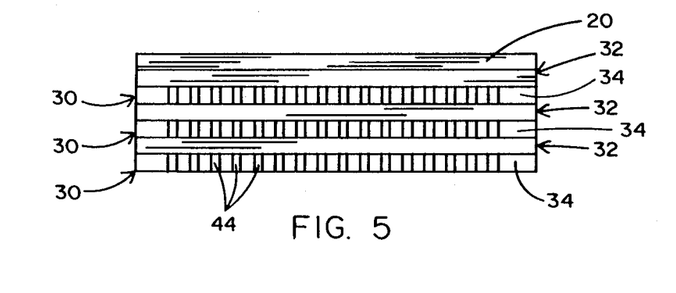
FIG. 5 is a front (access plane) view of several stacked layers.

FIG. 3 shows a single chip carrier, or sub-module, 14; and FIGS. 4 and 5 shows a partial stack of the sub-modules 14. Each sub-module, or chip carrier 14, includes a flat chip substrate 30, on which an IC chip 36 is mounted. One of the advantages of the present invention over the construction disclosed in application Ser. No. 856,835 is that a standard, mass produced chip may be used, without altering the position of the leads located along its edges. In FIG. 3, the chip 36 has multiple wire bonding pads, or terminals, 38 along two sides, and a single pad, or terminal on a third side. Also, the type of IC chip is not limited, i.e., gallium arsenide, silicon, or other materials are suitable.

The material securing the chip 36 to the substrate 30 is preferably not epoxy, because of the high operating temperatures encountered. A eutectic alloy, e.g., gold and silicon, may be used to die-attach the chip to the substrate. The gold-silicon alloy has a melting point high enough to withstand the operating tempeatures. The low alloying temperature (at 370° C.) permits an easy die attach operation. Another possibility is to use the solder reflow method, i.e., deposit solder on the back of the chip, and then melt it to cause adhesion. Still another possibility is to use a metal-glass material, such as silver glass, as the bonding agent. The material which attaches the chip to the substrate should, in any event, have good heat-conductive properties, in order to constitute part of a heat-dissipation path leading from each chip to the exterior of the completed electronics package. If the chip material is a non-conductor (e.g., gallium arsenide), the face of the chip, which has the heat-generating circuitry, preferably is in engagement with the substrate (via the attaching material).

A pattern of electrical conductors 40 are formed on substrate 30 by a suitable metallization process. Thick film conductors are preferred over thin film conductors, in part because of the relative roughness of the surface of the ceramic substrate.

The conductors 40 may be wire-bonded to the terminals 38, as indicated by connecting wires 42. This is a reliable process for commercial production of the units. If it becomes vital to reduce the thickness of the layers, other chip lead connecting techniques could be used, e.g., flip-chip bonding, or tape automated bonding (TAB). The flip-chip bonding process, however, is less reliable than wire bonding. The TAB process would be ideal for highly automated, large scale production. A description of the TAB process is given below.

An advantage of the present construction is that the thick film conductors 40 extend all the way to the edges 34 of the substrates 30. Conducting bonds 44 formed on the edges 34 (see FIG. 5) are connected to the conductors 40. The conductors 40 and conducting bands 44 on the sub-modules are electrically connected to the thick film conductors 22 (see FIG. 2) on the stack-carrying substrate.

The spacer 32 associated with each IC chip is a rectangular frame having a relatively large open center portion 46, which provides the cavity in which the chip is located. The same material, which is dielectric and thermally conducting, should be used to form the frame as is used to form the substrate 30. The frame 32 and the substrate 30 may be attached to one another by glass, if hermetic sealing is required, or by epoxy if hermetic sealing is not required. As shown in FIGS. 3 and 4, the lower end of each substrate 30 extends beyond the lower side of the corresponding frame 32. This provides spaces 33 which are useful as cleaning ports to remove solder, flux and dirt, and as inspection spaces. As discussed below, the frame/substrate assembly can also be made out of one solid piece, with metallization and chip on the back side, the adjacent assembly providing the cavity for the chip.

The chip/substrate/frame combination is considered the basic building block (sub-module) for the structure. A stack is then built comprising a desired number of these sub-modules; and then the entire stack is secured to the stack carrying/substrate 18. This may be accomplished by a combination of reflow soldering, to provide electrically-conducting paths, and electricallyinsulating epoxy filling the remainder of the space between edges 34 and stack-carrying substrate 18.

Figure 6:
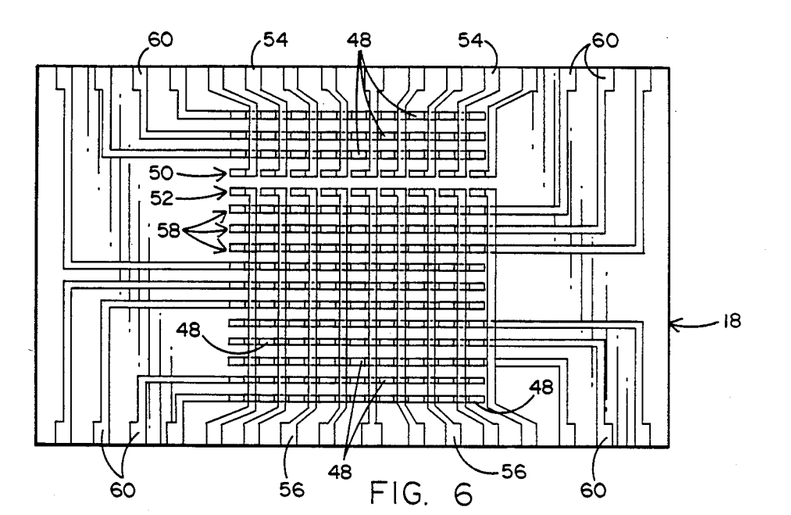
FIG. 6 is an enlarged plan view showing the stack-carrying substrate, and its metallization for exterior electrical connection.

FIG. 6 is an enlarged plan view of the stack-carrying substrate 18. It has numerous short metallized bands, or bumps, 48, which match the bands 44 (see FIG. 5) on the edges 34 of the chip-carrying substrates 30.

FIG. 6 shows 9 columns of metallized bands 48, indicating a complete stack of 9 sub-modules. FIG. 5, which shows only a partial stack, has three substrates 30, three frames 32, and the end cover 20. FIG. 6 shows 16 rows of metallized bands 48, corresponding to the sixteen metallized bands 44 seen on each layer in FIG. 5.

The preferred material for the electrical conductors on the layers and on the wiring board is gold. The preferred method of securing the bands 44 to the bands 48 is reflow soldering. Solder coatings are formed by silkscreen printing on top of the bands 44 and 48. Then the solder is briefly reflowed at an elevated temperature, thus bonding the stack of sub-modules to the stack-carrying substrate, while also providing electrical conduction between the metallized conducting bands 44 and 48. Heat dissipation can be increased by filling the gaps between the stack and the wiring board with heat-conducting, but electrically-insulating epoxy.

The heat conduction path, which dissipates circuitry-generated heat, flows directly from substrate 30, through the soldering connections, and into the stack-carrying substrate 18. The stack-carrying substrate conducts the heat to a location where it can be effectively dissipated. The complete heat-conduction path, from the chips, through the chip-carrying substrates, and the stack-carrying substrate, is not interrupted by any non-heat-conducting material.

The specific wiring pattern shown in FIG. 6 is dictated by the requirements of the circuitry in the stacked sub-modules 12. Each chip requires two individual leads (data-in and data-out) which can't be bussed with the corresponding leads for the other chips. These individual leads in FIG. 6 are in rows 50 and 52. The solder bumps 48 in row 50 are individually connected to 9 terminals 54 shown at the top of the figure, and the solder bumps 48 in row 52 are connected to 9 terminals 56, shown at the bottom of the figure. The remaining rows 58 are bussing leads, which interconnect all 9 of the chips, and which are connected to terminals 60 on both sides of substrate 18.

Figure 7:
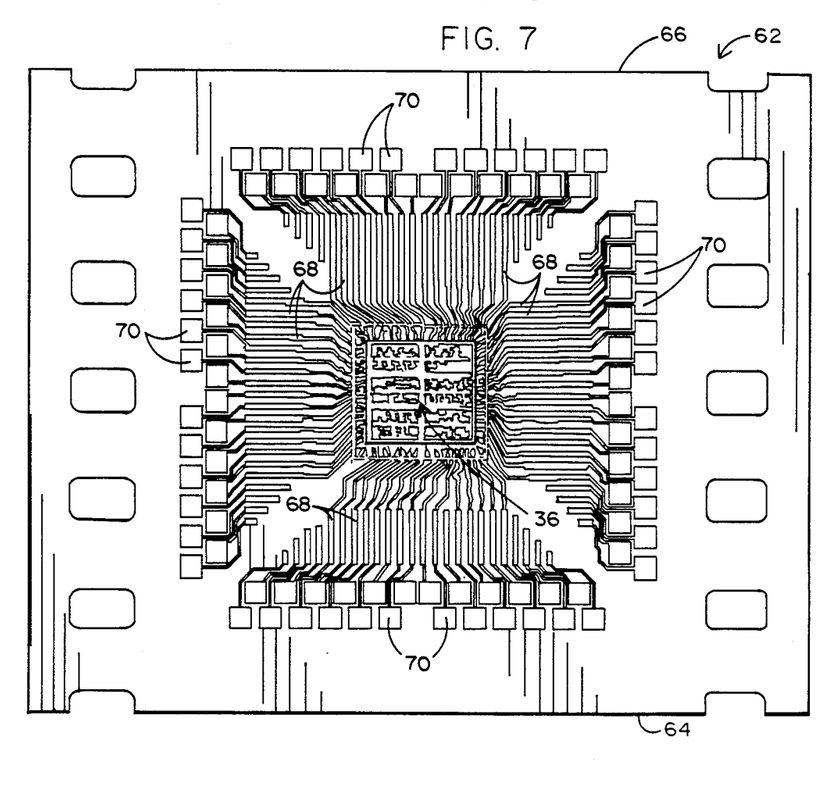
FIG. 7 is a plan view of a section of metallized tape which may be used in large scale automated production to provide flat leads, or fingers, to connect the bonding pads on each chip to the leads on its supporting substrate.

FIG. 7 shows a segment of tape of the type used in the tape automated bonding (TAB) process, mentioned above. The figure is merely exemplary of the general process; the number of leads shown is far greater than required for the structure of the preceding figures. The original tape is continuous; in FIG. 7 a segment 62 has been cut off at lines 64 and 66.

The tape, which may be formed using a polyimide backing material, serves as a carrier for metallic fingers 68, or conductors, which are eventually interconnected between the chip's wire bonding terminals 38 and the substrate conductors 40, i.e., each tape-provided finger connects one of the wire bonding terminals 38 to one of the conductors 40. Conducting fingers 68 are formed on the tape by a metallization process suitable for large scale production. In FIG. 7, the chip 36 is shown secured to the tape section.

Most of the metallization shown on the tape is eventually removed by trimming the tape. However, terminal pads 70 are provided to permit electrical testing of the chip-connected conductors. After such testing, the tape is trimmed, leaving only the short fingers required to connect the chip's wire bonding pads 38 to the leads 40 on substrate 30 (see FIG. 3). Each finger 68 may be soldered at both of its ends (to the terminals on the chip and to the substrate lead, respectively), using pre-deposited solder bumps (carried either on the tape fingers, or on the chip and substrate), which are melted to provide the final electricallyconducting connections.

Figure 8:
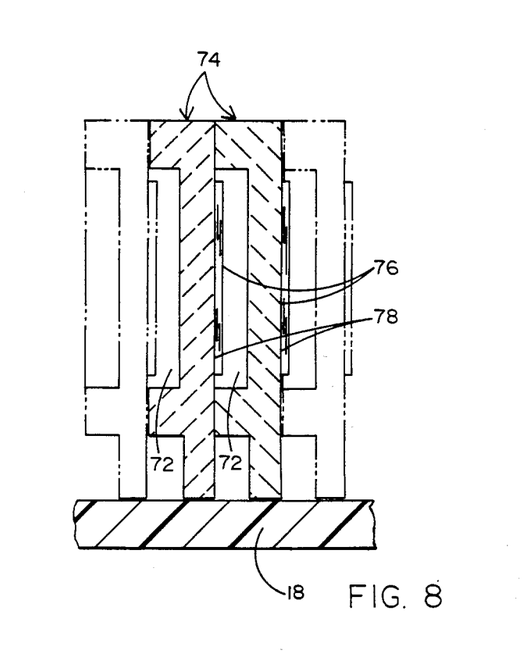
FIG. 8 is a cross-section of a modified version of the invention, in which the floor (substrate) and sides (frame) of a cavity are formed integrally, and each chip is supported on the back of the substrate and located inside the cavity of the next layer.

FIG. 8 shows another version of the picture frame structure, which may, in some instances, provide advantages over the version shown in FIGS. 1–6. Instead of using separate members to provide each sub-module unit, i.e., substrate 30 and frame-shaped spacer 32, the floor and sides of the cavity in FIG. 8 are formed from a single piece of material. This is accomplished by forming a recess 72 in a solid block of ceramic material 74 (preferably beryllium oxide). IC chips 76 are then mounted on the flat surfaces 78 of the respective blocks. The recesses 72 provide cavities for the chips.

Advantages of the FIG. 8 version include the fact that fewer pieces are required, which can reduce manufacturing time. Also the number of interface glue lines is reduced, thus simplifying one of the major manufacturing problems. Additionally, the flat space provided for chip support would facilitate the use of the TAB process (which allows additional increase in density).

Figure 9:
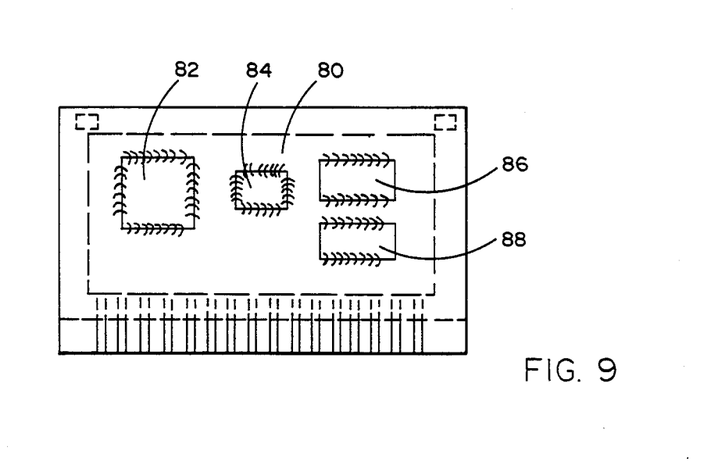
FIG. 9 shows a single layer having a plurality of IC chips located in the same cavity.

FIG. 9 illustrates the concept of combining a plurality of IC chips in a single layer of the stack. The floor 80 of the layer (which may have the structure of either FIG. 4 or FIG. 8) supports four chips 82, 84, 86 and 88, each of which has its bonding terminals connected to suitable leads provided on floor 80. The chips will be interconnected in order to combine their functions within a single layer. Lead-out conductors 90 on floor 80 extend to and around the edge 92 of the layer. A stack of layers will then be mechanically and electrically connected to the stack-carrying substrate, in the manner previously described.

The combination of multiple IC chips in each layer permits interconnecting circuitry within the layer which significantly reduces the complexity of exterior electrical leads.

From the foregoing description, it will be apparent that the structures and methods disclosed in this application will provide the significant functional benefits summarized in the introductory portion of the specification.

The following claims are intended not only to cover the specific embodiments disclosed, but also to cover the inventive concepts explained herein with the maximum breadth and comprehensiveness permitted by the prior art.

What is claimed is:

1. A method of forming a high-density electronic package comprising:
   forming a chip-carrying substrate which (a) has a metallization pattern thereon to provide electrical conductors extending to at least one conductor-providing edge of the substrate, and (b) provides a heat-conducting path to said edge of the substrate;
   securing at least one IC chip to the chip-carrying substrate, such IC chip having electrical terminals thereon;
   connecting the electrical terminals of the IC chip to the conductors on the chip-carrying substrate;
   forming a spacer having a frame surrounding an open center portion;
   securing the spacer to the chip-carrying substrate with the IC chip inside the open center portion;
   the chip-carrying substrate, IC chip and spacer being a sub-module assembly;
   securing together several of such sub-module assemblies to provide an integrated stack, containing several IC chips;
   forming a stack-carrying substrate which (a) has a metallization pattern thereon to provide electrical conductors, and (b) provides a heat-conducting path;
   integrating the stack of sub-module assemblies with the stack-carrying substrate by securing the conductor-providing edges of the chip-carrying substrates to the stack-carrying substrate in such a way as to (a) connect the conductors on the chip-carrying substrates to the conductors on the stack-carrying substrate, and (b) provide direct heat conduction from the edges of the chip-carrying substrates to the stack-carrying substrate.

2. The method of claim 1 in which the chip-carrying substrates and spacers are formed of material which is both electrically non-conductive and thermally conductive.

3. The method of claim 2 in which the material is beryllium oxide.

4. The method of claim 1 in which the dimensions of each spacer are such that, in each sub-module assembly, the conductor-providing edge of the chip-carrying substrate is located beyond the adjacent edge of the spacer, in order to provide an open space between the stack-carrying substrate and the spacer.

5. The method of claim 1 in which the chip-carrying substrates and spacers in the integrated stack are secured together in such a way as to provide a hermetic seal; and
   a cover is applied over the end spacer and hermetically sealed to it.

6. A high-density electronic package comprising:
   a stack-carrying, heat-conducting substrate having conductors formed thereon;
   a stack of sub-module assemblies extending in planes perpendicular to the stack-carrying substrate, and having edges secured to the stack-carrying substrate;
   each sub-module assembly comprising:
      (a) a chip-carrying, heat-conducting substrate having electrical conductors thereon, and having an edge secured to the stack-carrying substrate in such a way that heat is conducted from the chip-carrying substrate into the stackcarrying substrate;
      (b) an IC chip mounted on the chip-carrying substrate and electrically connected to the conductors on that substrate; and
      which the IC chip is located, and which is secured to the chip-carrying substrate;
   each spacer determining the distance between adjacent chip-carrying substrates in the stack of sub-module assemblies; and
   each chip-carrying substrate having its electrical conductors extending to the edge which is secured to the stack-carrying substrate and electrically connected to corresponding conductors on the stack-carrying substrate.

7. The electronic package of claim 6 in which the stack-carrying substrate, the chip-carrying substrates, and the spacers are all formed of electrically non-conducting material which has relatively high thermal conductivity.

8. The electronic package of claim 7 in which the material is beryllium oxide.

9. The electronic package of claim 6 in which the edges of the chip-carrying substrates which are secured to the stack carrying substrate extend beyond the adjacent edges of the spacers, in order to provide open spaces between the peripheries of the spacers and the stack-carrying substrate.

10. The electronic package of claim 6 in which the edge of each chip-carrying substrate is secured to the stack-carrying substrate by reflow soldering.

11. The electronic package of claim 6 in which the IC chips are gallium arsenide chips.

12. A high density electronic package containing IC chips, comprising:
   a stack-carrying, heat-conducting substrate having electrical conductors formed thereon; and
   a stack containing sub-modules extending in planes perpendicular to the stack-carrying substrate, and each having an edge secured to the stack-carrying substrate in such a way that heat is conducted from the sub-module into the stack-carrying substrate;
   each sub-module having a heat-conducting, chip-carrying surface and a chip-surrounding cavity;
   at least one IC chip mounted on the chip-carrying surface of each sub-module;
   each chip-carrying surface having electrical conductors thereon which extend to the sub-module edge secured to the stack-carrying substrate, and which are electrically connected to corresponding conductors on the stack-carrying substrate.

13. The electronic package of claim 12 in which:
   the chip-surrounding cavity in each sub-module is provided inside a single piece of material; and
   the chip which is located inside the cavity of one sub-module is supported on the surface of the adjacent sub-module.

14. The electronic package of claim 13 in which the material of each sub-module is a heat-conducting ceramic material the chip which is located inside the cavity of one sub-module is supported on the surface of the adjacent sub-module.

15. A method of forming a high-density electronic package containing IC chips, comprising:
- forming a plurality of sub-modules, each having a chip-surrounding cavity and a heat-conducting chip-carrying surface;
- providing electrical conductors on the chip-carrying surface of each sub-module;
- mounting at least one chip on each chip-carrying surface and connecting it to the electrical conductors on that surface;
- stacking and securing together a plurality of sub-modules;
- providing a heat-conducting stack-carrying substrate having electrical conductors formed thereon; and
- securing the stacked sub-modules to the stack-carrying substrate with each sub-module extending in a plane perpendicular to the stack-carrying substrate, with a direct heat-conducting path from each sub-module into the stack-carrying substrate electrically connected to the electrical conductors on the chip-carrying surface of the sub-modules;
- each chip being located in a cavity of a sub-module.

16. The method of claim 15 in which each chip is mounted on the chip-carrying surface of one sub-module, and located inside a cavity of another sub-module.

17. The method of claim 16 which also comprises the step of:
- etching a recess in a block of sub-module material to form a chip-surrounding cavity therein.

18. The method of claim 15 in which each chip is connected to the electrical conductors on its respective chip-carrying surface by the following process;
- forming a non-metallic tape carrying a plurality of electrically-conducting fingers;
- soldering in a single step one end of each finger to an electrical terminal on the chip; and
- soldering in a single step the other end of each finger to one of the electrical conductors on the chip-carrying surface.

* * * * *

UNITED STATES PATENT AND TRADEMARK OFFICE
CERTIFICATE OF CORRECTION

PATENT NO. : 4,764,846
DATED : August 16, 1988
INVENTOR(S) : Tiong C. Go

It is certified that error appears in the above-identified patent and that said Letters Patent is hereby corrected as shown below:

Column 2, line 44: After "aluminum oxide" change "(AlO)" to -- (AlO) --.

Column 2, line 53: Correct the spelling of "cavity".

Column 4, line 66: Change "bonds" to -- bands --.

Claim 6, Column 8, between lines 12 and 13: Insert the following line -- (c) a frame-shaped spacer which provides a cavity in --.

Claim 14, Column 8, line 68: Place a period at the end of the line.

Claim 14, Column 9: Cancel everything in lines 1 through 3.

Claim 15, Column 9, line 22: After "substrate" insert the following -- , and with the electrical conductors on the

UNITED STATES PATENT AND TRADEMARK OFFICE
CERTIFICATE OF CORRECTION

PATENT NO. : 4,764,846

DATED : August 16, 1988

INVENTOR(S) : Tiong C. Go

It is certified that error appears in the above-identified patent and that said Letters Patent is hereby corrected as shown below:

stack-carrying substrate --.

Signed and Sealed this

Fourteenth Day of February, 1989

Attest:

DONALD J. QUIGG

*Attesting Officer*  *Commissioner of Patents and Trademarks*